United States Patent
Jeong

(10) Patent No.: US 7,704,822 B2
(45) Date of Patent: Apr. 27, 2010

(54) SEMICONDUCTOR DEVICE

(75) Inventor: Hyeong Gyun Jeong, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 192 days.

(21) Appl. No.: 11/613,066

(22) Filed: Dec. 19, 2006

(65) Prior Publication Data

US 2007/0164392 A1 Jul. 19, 2007

(30) Foreign Application Priority Data

Dec. 27, 2005 (KR) .................. 10-2005-0130861

(51) Int. Cl.
*H01L 21/8238* (2006.01)

(52) U.S. Cl. .............. 438/217; 438/218; 438/289; 438/529; 257/E21.135

(58) Field of Classification Search ........ 438/298, 438/410, 418–420, 433, 449–451, 163, 217–219, 438/221, 223–225, 227, 228, 231, 232, 276, 438/289, 291, 306, 307, 519, 521, 527, 529, 438/546, 549, 294; 257/369, 371, 372, 376, 257/394, 398, 399, 402, E21.043, E21.057, 257/E21.135, E21.557, E21.558, E21.618, 257/E21.619, E21.628, E21.633, E21.634, 257/E21.642, E21.058

See application file for complete search history.

(56) References Cited

U.S. PATENT DOCUMENTS

| 5,484,742 | A | * | 1/1996 | Urai | 438/449 |
|---|---|---|---|---|---|
| 5,571,737 | A | * | 11/1996 | Sheu et al. | 438/291 |
| 5,747,372 | A | * | 5/1998 | Lim | 438/298 |
| 6,146,977 | A | * | 11/2000 | Sera | 438/450 |
| 6,306,700 | B1 | * | 10/2001 | Yang | 438/217 |
| 6,649,481 | B2 | * | 11/2003 | Wu | 438/301 |
| 6,821,858 | B2 | * | 11/2004 | Namatame et al. | 438/298 |
| 6,846,722 | B2 | * | 1/2005 | Lee | 438/449 |
| 7,214,591 | B2 | * | 5/2007 | Hsu | 438/298 |
| 7,425,752 | B2 | * | 9/2008 | Lowis | 257/519 |
| 2001/0023106 | A1 | * | 9/2001 | Choi et al. | 438/291 |
| 2002/0064925 | A1 | * | 5/2002 | Onodera et al. | 438/449 |
| 2002/0072169 | A1 | * | 6/2002 | Onodera et al. | 438/232 |
| 2004/0033667 | A1 | * | 2/2004 | Lee | 438/298 |
| 2004/0104436 | A1 | * | 6/2004 | Walker et al. | 257/355 |
| 2004/0245583 | A1 | * | 12/2004 | Horiuchi et al. | 257/408 |
| 2006/0024910 | A1 | * | 2/2006 | Chatterjee et al. | 438/424 |
| 2006/0216892 | A1 | * | 9/2006 | Mouli | 438/257 |
| 2006/0273359 | A1 | * | 12/2006 | Mori | 257/291 |
| 2008/0029796 | A1 | * | 2/2008 | Mori et al. | 257/292 |
| 2008/0054411 | A1 | * | 3/2008 | Jeong | 257/622 |

FOREIGN PATENT DOCUMENTS

JP 10284725 * 10/1998

* cited by examiner

*Primary Examiner*—Matthew C Landau
*Assistant Examiner*—Joseph C Nicely
(74) *Attorney, Agent, or Firm*—Sherr & Vaughn, PLLC

(57) ABSTRACT

Embodiments relate to a semiconductor device. According to embodiments, a semiconductor device may include a plurality of wells formed on a substrate, threshold voltage control ion layers formed around surfaces of the wells, device isolation layers arranged between the wells, ion compensation layers formed on edges and bottoms of the device isolation layers, and a gate formed on the well.

6 Claims, 5 Drawing Sheets

SEMICONDUCTOR DEVICE

The present application claims priority under 35 U.S.C. 119 and 35 U.S.C. 365 to Korean Patent Application No. 10-2005-0130861 (filed on Dec. 27, 2005), which is hereby incorporated by reference in its entirety.

BACKGROUND

A semiconductor device may be used as a memory device, for example such as a NAND flash, and may be used as a switching device such as a low voltage transistor or a high voltage transistor.

A high voltage transistor may be included in a driving IC of a display device, and may have to withstand a high voltage.

FIG. 1 is an example diagram illustrating a related art high voltage transistor. FIG. 2 is an example sectional view taken along line I-I' in the high voltage transistor of FIG. 1. FIG. 1 illustrates only one high voltage transistor, for convenience. However, a plurality of high voltage transistors as illustrated in FIG. 1 may be included in an integrated circuit (IC).

Reference letter A denotes a region in which a transistor may be formed and reference letter P denotes an ion implantation region for forming source/drain regions.

FIG. 1 may be considered an NMOS type, for convenience.

Referring to FIGS. 1 and 2, p type well 3 may be provided to form a transistor on semiconductor substrate 1. Hence, the substrate may be a p type doped silicon substrate.

A plurality of p type wells 3 or a plurality of n type wells may be formed on semiconductor substrate 1, and may be separated from each other by a prescribed interval (for example, a region in which a device isolation layer may be formed later). P type well 3 may be doped with p type impurities (such as boron (B)) and the n type well may be doped with n type impurities (such as arsenic (As)). An NMOS type high voltage transistor may be formed in p type well 3 and a PMOS type high voltage transistor may be formed in the n type well.

To form a well, doped impurities may have low density.

P type well 3 may be deeply formed in semiconductor substrate 1. Since p type well 3 may be deeply formed in semiconductor substrate 1, when a device is driven, an electric field may be dispersed to increase a breakdown voltage so as to withstand high voltage.

Device isolation layers 5 may be formed on semiconductor substrate 1 and may distinguish the wells from each other. Transistors may be insulated and separated from each other by device isolation layers 5. Device isolation layers 5 may be formed by a local of silicon (LOCOS) method or a shallow trench isolation (STI) method.

A silicon oxidation layer and a poly silicon may be laminated on semiconductor substrate 1 where device isolation layers 5 may be formed and may be patterned to form gate 7.

In p type well 3 of semiconductor substrate 1, source/drain regions (not shown) may be formed in the region excluding gate 7.

Although not shown in the drawing, threshold voltage Vt controlling ions may be thinly implanted into a surface of p type well 3. The threshold voltage controlling ions may be implanted into p type well 3 after forming device isolation layer 5.

The threshold voltage control ions may be distributed on a surface of p type well 3 but may move in accordance with external factors, for example such as heat.

That is, as illustrated in FIG. 3, when threshold voltage control ions 6 are heated, the threshold voltage control ions may not remain stationary around the surface of p type well 3. Some of the displaced ions may be found around the edges of the device isolation layers and, in severe cases, may penetrate device isolation layers 5.

In the related art high voltage transistor, threshold voltage Vt control ions may exist on a surface of the p type well and may freely move and penetrate the device isolation layers when heated. The threshold voltage control ions may become non-uniform, and may deteriorate operational characteristics of the device.

Therefore, according to the related art, although a desired amount of threshold voltage control ions may be implanted into p type well 3, threshold voltage control ions 6 may not be uniformly diffused in p type well 3, and doping density may be locally reduced. The non-uniform ion density distribution may cause a hump phenomenon, which may degrade the performance of a device.

SUMMARY

Embodiments relate to a semiconductor device and a method of manufacturing a semiconductor device.

Embodiments relate to a semiconductor device that may be capable of making ion density distribution in a well uniform, which may improve a performance of a device, and a method of manufacturing the same.

According to embodiments, a semiconductor device may include a plurality of wells formed on a substrate, threshold voltage control ion layers formed around surfaces of the wells, device isolation layers arranged between the wells, ion compensation layers formed on edges and bottoms of the device isolation layers, and a gate formed on the well.

According to embodiments, a method of manufacturing a semiconductor device including a plurality of PMOS transistors and a plurality of NMOS transistors may include ion implanting first conductive type impurities into a semiconductor substrate to form a plurality of wells corresponding to the transistors, ion implanting second conductive impurities into the wells in order to control a threshold voltage, forming device isolation layers between the wells on the semiconductor substrate in order to separate the wells from each other, ion implanting third conductive impurities into the wells to form ion compensation layers on edges and bottoms of the device isolation layers, ion implanting fourth conductive impurities into the wells to form source/drain regions, and forming a gate on the wells.

According to embodiments, a method of manufacturing a semiconductor device including a plurality of PMOS transistor and a plurality of NMOS transistors may include forming a plurality of device isolation layers for dividing the transistors on a semiconductor substrate, ion implanting first conductive impurities into the semiconductor substrate between the device isolation layers to form a plurality of wells corresponding to the transistors, ion implanting second conductive impurities into the wells, ion implanting third conductive impurities into the wells to form ion compensation layers on edges and bottoms of the device isolation layers, ion implanting fourth conductive impurities into the wells to form source/drain regions, and forming a gate on the well.

DETAILED DESCRIPTION OF EMBODIMENTS

Figure 1:
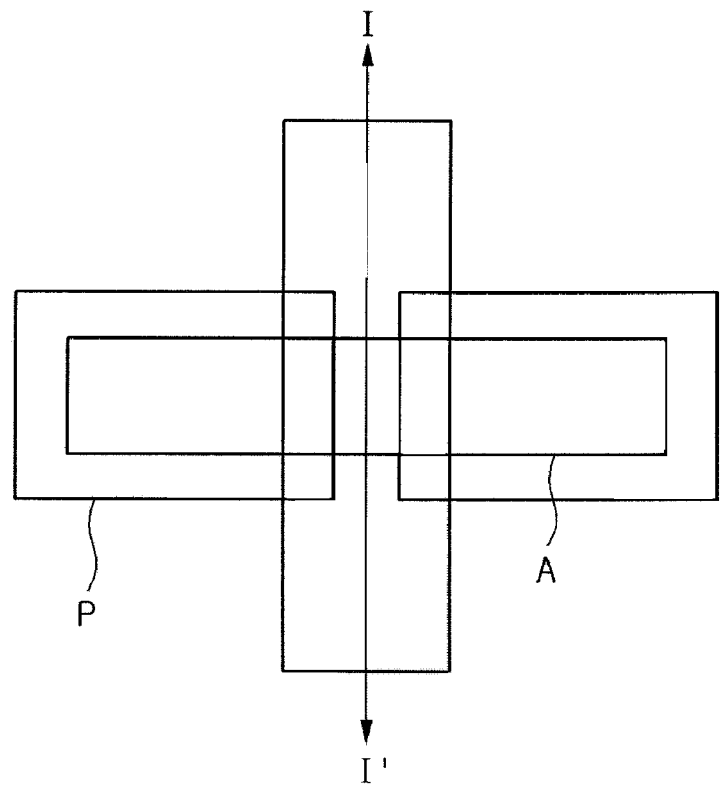
FIG. 1 is an example diagram illustrating a related art high voltage transistor.
Figure 2:
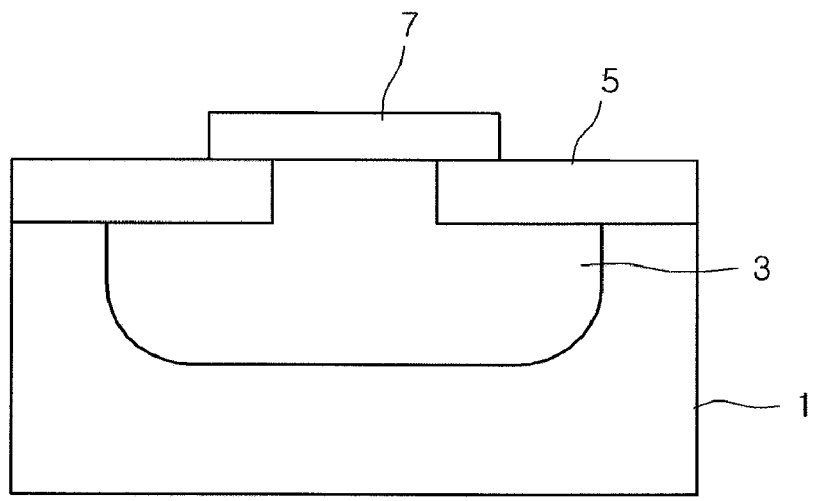
FIG. 2 is an example sectional view taken along the line I-I' in the high voltage transistor illustrated in FIG. 1.
Figure 3:
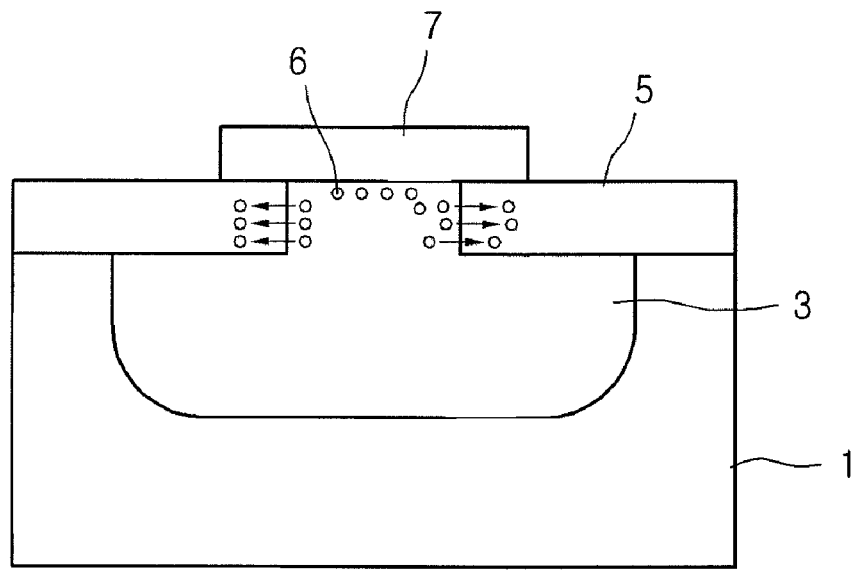
FIG. 3 as an example diagram illustrating movement of threshold voltage control ions in the high voltage transistor illustrated in FIG. 1.
Figure 4:
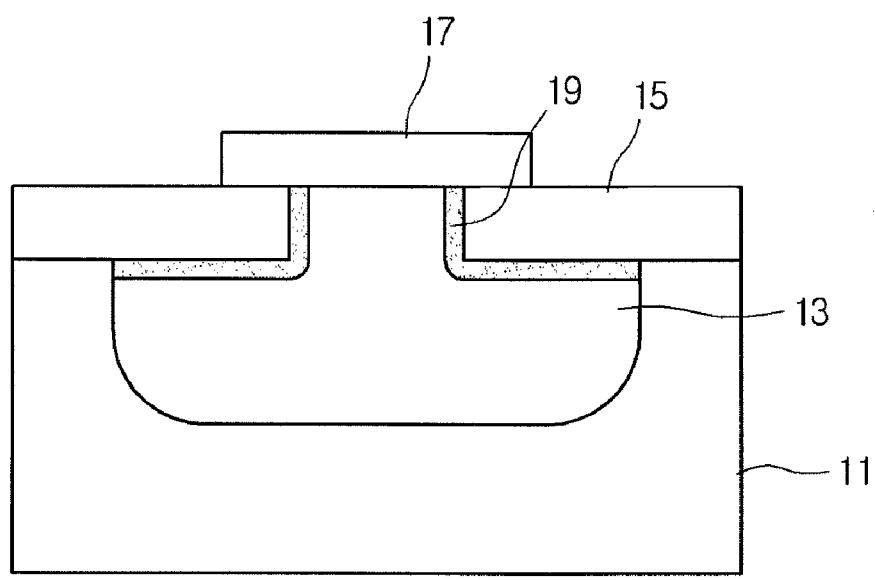
FIG. 4 is an example diagram illustrating a high voltage transistor according to embodiments.

FIG. 4 is an example diagram illustrates a high voltage transistor according to embodiments.

For convenience, the high voltage transistor illustrated in FIG. 4 may be a NMOS transistor. However, embodiments may also be applied to a PMOS high voltage transistor. In a package type semiconductor device, a plurality of PMOS transistors and NMOS transistor may be adjacent to each other with device isolation layers interposed therebetween. Referring to FIG. 4, in a high voltage transistor according to embodiments, p type well 13 for forming a transistor may be formed on semiconductor substrate 11. That is, a p type doped silicon substrate may be provided. Therefore, boron (B) ions of high energy may be implanted into semiconductor substrate 11. Using boron (B) ions having high energy, p type well 13 may be formed in a deep region of the semiconductor substrate.

Although not shown, boron (B) ions of low energy may be implanted into semiconductor substrate 11 where p type well 13 may be formed to control a threshold voltage Vt. According to embodiments, the boron (B) ions may be implanted into the surface of p type well 13.

Device isolation layers 15 may be formed on semiconductor substrate 11 where p type well 13 may be formed to divide a well region. Device isolation layers 15 may be formed by a LOCOS method using thermal oxidation or an STI method using deposition and etching.

Device isolation layers 15 may be formed over a least a portion of p type well 13. That is, the edges of device isolation layers 15 may partially cover the surface of p type well 13. According to embodiments, p type well 13 may be formed to parts of the bottom surfaces of device isolation layers 15.

According to embodiments, p type well 13 may be formed to prevent an electric field from being concentrated when a device is driven, to increase a breakdown voltage, and to thus increase an ability to withstand high voltage. Therefore, a high voltage transistor may be created by such a well structure.

Although not shown, source/drain regions may be formed in p type well 13. The source/drain regions may be formed by ion implantation of n type impurities (such as arsenic (As)).

Ion compensation layers 19 may be formed in a vicinity of the edges and the bottoms of device isolation layers 15. In embodiments, this may include the edges and it is a portion of bottoms of device isolation devices 15 that may be over and/or connected to p type well 13.

Ion compensation layers 19 may be formed by p type impurities (for example, boron (B)) 13. The p type impurities of ion compensation layers 19 may have higher density than the p type impurities of p type well 13. That is, the p type impurities of ion compensation layer 19 may relate to p type impurities for forming the source/drain regions of another adjacent transistor (such as a PMOS high voltage transistor).

Therefore, a plurality of NMOS type high voltage transistors and a plurality of PMOS type high voltage transistors may be adjacent to each other with device isolation layers 15 therebetween in a package type semiconductor device. The source/drain regions of a NMOS type high voltage transistor and the ion compensation layers of the PMOS type high voltage transistor may be formed by n type impurities. The source/drain regions of a PNMOS high voltage transistor and ion compensation layers 19 of a NMOS type high voltage transistor may be formed by p type impurities.

Gate 17 formed of a silicon oxide layer and poly silicon may be formed on semiconductor substrate 11 where device isolation layers 15 may be formed.

To compensate for movement of the threshold voltage Vt control ions, ion compensation layers 19 may be formed to be connected to the edges and bottoms of the device isolation layers.

Ion compensation layers 19 may be formed of the same material as the threshold voltage Vt control ions. It may be possible to compensate for the ions that penetrate device isolation layers 15 by ion compensation layers 19.

Therefore, although a thermal process may be performed by ion compensation layers 19, a density of the threshold voltage Vt control ions may not change. Accordingly, ions may be uniformly distributed and may stably operate. It may thus be possible to improve operational characteristics of a device.

FIGS. 5 to 9 illustrate a method of manufacturing a high voltage transistor that is a semiconductor device according to embodiments.

Figure 5:
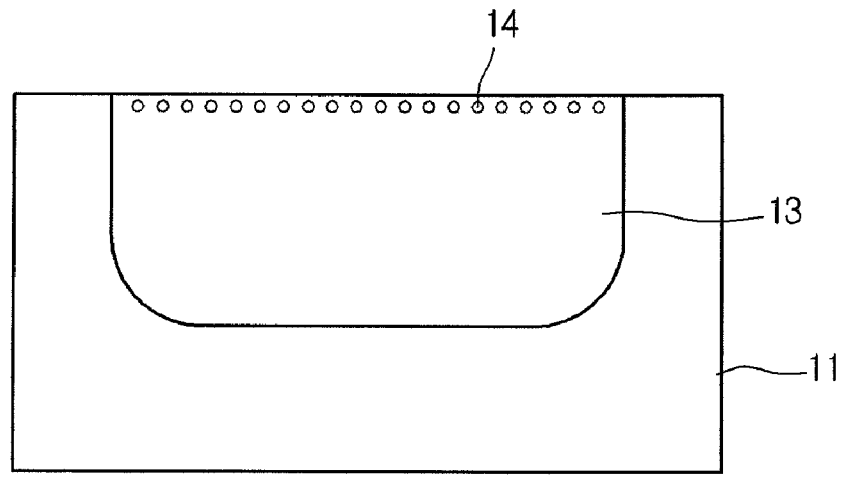
FIGS. 5 to 9 are example diagrams illustrating a method of manufacturing a high voltage transistor according to embodiments.

Referring to FIG. 5, high energy ions (B) may be implanted into semiconductor substrate 11, for example, a silicon substrate to form p type well 13. Since the ions (B) may have high energy, p type well 13 may be deeply and widely formed in semiconductor substrate 11. An electric field may be dispersed by wide p type well 13 when the device is driven. Accordingly, a breakdown voltage may increase and it may be possible to withstand a high voltage.

Ions (B) of low energy may be implanted into p type well 13 so that a threshold voltage may be controlled. The ions (B) of low energy may be implanted into a surface of p type well 13. Threshold voltage control ions 14 may operate as a reference voltage for operating a device. That is, the device may not operate at the threshold voltage or less and may operate only at a voltage exceeding the threshold voltage.

After the ion implantation process is completed, annealing may be performed so that the implanted ions may move to form a lattice. According to embodiments, the ions may move to form the lattice while being activated. The annealing may be performed-by various methods, including a furnace annealing method, a rapid thermal annealing (RTA) method, and a laser thermal processing method.

Figure 6:
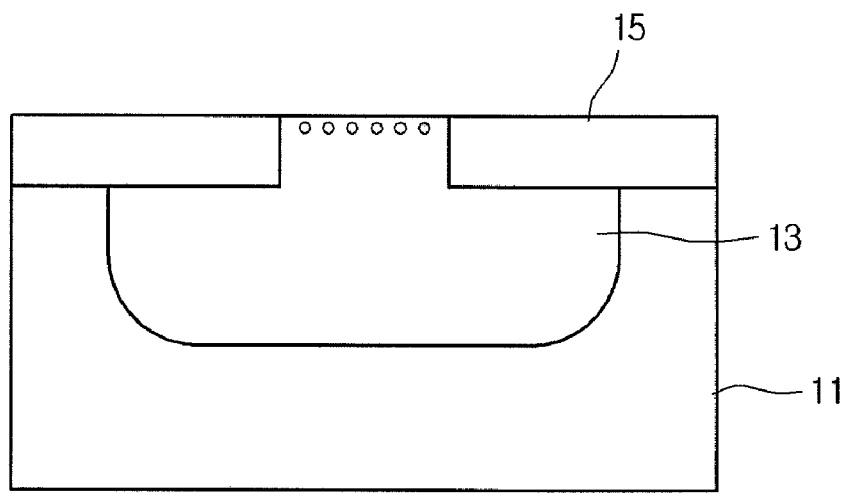

Referring to FIG. 6, device isolation layers 15 for insulating and separating wells from each other may be formed on semiconductor substrate 11 where p type well 13 may be formed. Device isolation layer 15 may be formed by the LOCOS method or the STI method.

Figure 7:
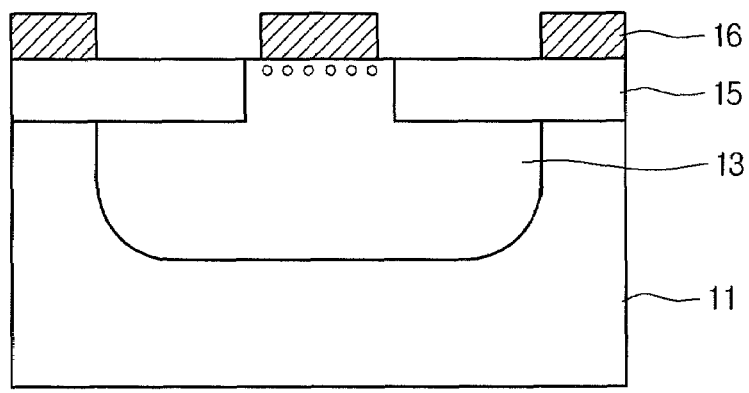

Referring to FIG. 7, mask pattern 16 may be formed on semiconductor substrate 11 where device isolation layers 15 may be formed so that the region excluding the region in which a gate is to be formed is exposed.

Figure 8:
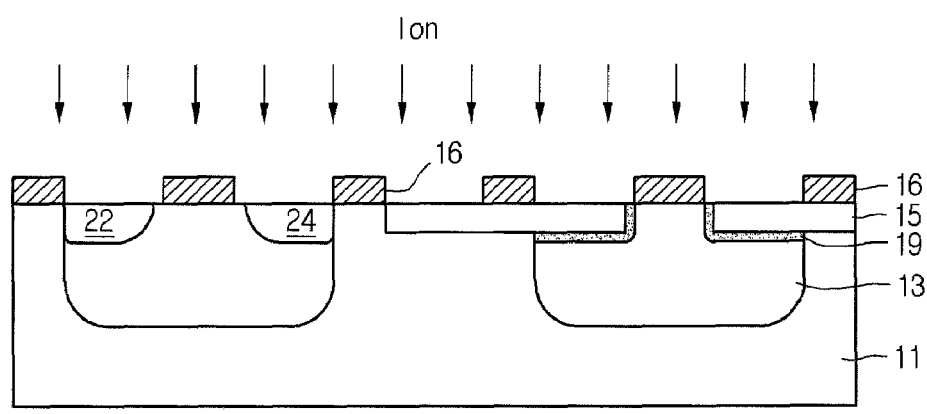

Referring to FIG. 8, ions may be implanted into mask pattern 16 on semiconductor substrate 11. In such a case, the ions may be implanted into p type well 13 region exposed to the outside by mask pattern 16. As a result, the ions may be implanted into the edges and bottoms of device isolation layers 15 and may form ion compensation layers 19.

The ions that form ion compensation layers 19 may be ions used to form the source/drain regions 22 and 24 of another transistor (such as a PMOS type high voltage transistor. That is, ion compensation layers 19 of the NMOS type high voltage transistor and the source/drain regions 22 and 24 of the PMOS type high voltage transistor may be simultaneously formed using the same ions (p type impurities such as boron (B)).

The source/drain regions of the NMOS type high voltage transistor and the ion compensation layers of the PMOS type high voltage transistor may be simultaneously formed of the same ions (n type impurities such as arsenic (As)).

Source/drain regions (not shown) may be formed in p type well 13 on semiconductor substrate 11 where ion compensation layers 19 may be formed using the n type ions (such as arsenic (As)). The source/drain regions and the ion compensation layers of the PMOS type high voltage transistor may be simultaneously formed using the same ions.

When ion compensation layers 19 and the source/drain regions may be formed, an annealing process may be performed to activate the implanted ions, so that ion compensation layers 19 and the source/drain regions may be formed.

Figure 9:
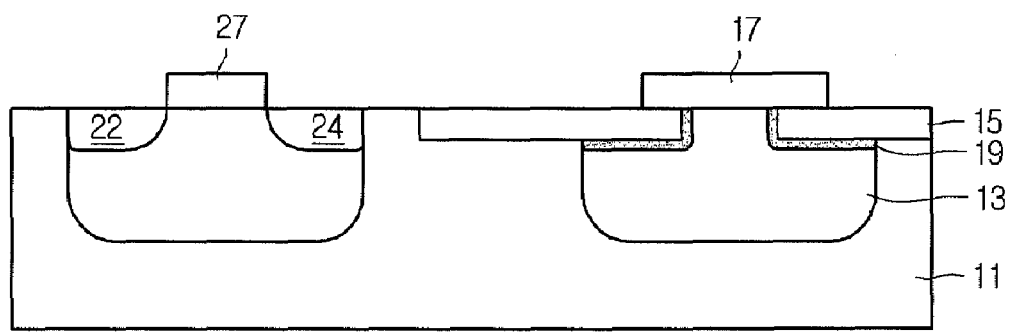

Referring to FIG. 9, semiconductor substrate 11, where device isolation layers 15 may be formed, may be thermally oxidized to grow a gate oxide layer. Polysilicon may be deposited on the gate oxide layer using a chemical vapor deposition (CVD) process. The polysilicon and the gate oxide layer may be patterned using a photolithography process to form gate 17.

According to embodiments, p type well 13 may be formed first and then, device isolation layers 15 may be formed. According to embodiments, device isolation layers 15 may be formed first, and then p type well 13 may be formed. As a result, p type well 13 and device isolation layers 15 may be formed in a reverse order.

According to embodiments, the ion compensation layers of an NMOS type high voltage transistor may be formed of the ions (such as the p type impurities) for forming the source/drain regions 22 and 24 of a PMOS type high voltage transistor and the ion compensation layers of the PMOS type high voltage transistor may be formed of the ions (such as the n type impurities) for forming the source/drain regions of the NMOS high voltage transistor. Accordingly, it may be possible to compensate for the threshold voltage control ions that penetrate the device isolation layers, to maintain the uniform threshold voltage ion, and to thus improve operational characteristics of the device.

According to embodiments, the ion compensation layers may be formed on the boundary between the device isolation layers and the p type well to compensate for the threshold voltage control ions that penetrate the device isolation layers by the thermal process so that the threshold voltage control ions are uniformly distributed. Accordingly, it may be possible to reduce a hump characteristic and to improve the operational characteristics of the device.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method, comprising:
   ion implanting first conductive type impurities into a semiconductor substrate to form a well;
   ion implanting second conductive impurities into the well to control a threshold voltage;
   forming device isolation layers over portions of the well and the semiconductor substrate; and
   ion implanting third conductive impurities into the well to form ion compensation layers of a first type high voltage transistor contacting edges and at least a portion of bottoms of the device isolation layers and in the well to compensate for threshold voltage control ions,
   wherein the ion compensation layers of the first type high voltage transistor and source/drain regions of a second type high voltage transistor are formed at the same time using the third conductive impurities in said ion implanting third conductive impurities.

2. The method of claim 1, further comprising forming a gate of the first type high voltage transistor over the well and at least a portion of the device isolation layers after said ion implanting third conductive impurities.

3. The method of claim 1, wherein the first, second, and third conductive impurities comprise substantially identical materials.

4. The method of claim 1, wherein the ion compensation layer is formed only between the device isolation layers and the well.

5. A method comprising:
   ion implanting first conductive impurities into at least one well in a semiconductor substrate to control a threshold voltage;
   forming a plurality of device isolation layers over the at least one well; and
   ion implanting second conductive impurities into the at least one well to form ion compensation layers of a first type high voltage transistor contacting edges and at least a portion of bottoms of the device isolation layers in the at least one well to compensate for threshold voltage control ions,
   wherein the ion compensation layers of the first type high voltage transistor and source/drain regions of a second type high voltage transistor are formed at the same time using the second conductive impurities in said ion implanting second conductive impurities.

6. The method of claim 5, further comprising forming a gate of the first type high voltage transistor over the at least one well, wherein the gate is further formed over at least a portion of at least two device isolation layers.

* * * * *